(12) United States Patent
Koehle et al.

(10) Patent No.: US 7,424,144 B2
(45) Date of Patent: Sep. 9, 2008

(54) METHOD FOR CHECKING PERIODIC STRUCTURES ON LITHOGRAPHY MASKS

(75) Inventors: Roderick Koehle, Ottobrunn (DE); Martin Verbeek, Munich (DE)

(73) Assignee: Infineon Technologies AG, Munich (DE)

( * ) Notice: Subject to any disclaimer, the term of this patent is extended or adjusted under 35 U.S.C. 154(b) by 685 days.

(21) Appl. No.: 10/894,640

(22) Filed: Jul. 20, 2004

(65) Prior Publication Data

US 2005/0048379 A1    Mar. 3, 2005

(30) Foreign Application Priority Data

Jul. 31, 2003    (DE) ............................. 103 35 565

(51) Int. Cl.
*G06K 9/00*    (2006.01)
*G01B 11/02*   (2006.01)
(52) U.S. Cl. .................... 382/141; 356/496; 977/840
(58) Field of Classification Search ............... 382/141, 382/144–150; 359/368, 379, 385–398; 356/400–401, 356/493–509, 237.2–237.6; 396/429–434; 977/840, 860–869
See application file for complete search history.

(56) References Cited

U.S. PATENT DOCUMENTS

| | | | | |
|---|---|---|---|---|
| 3,775,104 A * | 11/1973 | Matsumoto et al. | ............ | 430/35 |
| 4,899,224 A * | 2/1990 | Ooba et al. | .................... | 386/42 |
| 5,216,257 A * | 6/1993 | Brueck et al. | ............... | 250/548 |
| 5,248,574 A * | 9/1993 | Kamon | ........................... | 430/5 |
| 5,262,258 A * | 11/1993 | Yanagisawa | .................. | 430/22 |
| 5,309,198 A * | 5/1994 | Nakagawa | .................... | 355/67 |
| 5,329,333 A * | 7/1994 | Noguchi et al. | ............... | 355/53 |
| 5,386,294 A * | 1/1995 | Ototake et al. | ............... | 356/401 |
| 5,402,224 A * | 3/1995 | Hirukawa et al. | ........... | 356/124 |
| 5,706,091 A * | 1/1998 | Shiraishi | ..................... | 356/399 |
| 5,734,498 A * | 3/1998 | Krasieva et al. | ............. | 359/387 |
| 6,251,544 B1 * | 6/2001 | Inoue et al. | .................. | 382/145 |
| 6,317,211 B1 | 11/2001 | Ausschnitt et al. | | |
| 6,765,651 B1 * | 7/2004 | Fiekowsky et al. | .......... | 382/144 |
| 2004/0021936 A1 * | 2/2004 | Czarnetzki et al. | .......... | 359/368 |
| 2007/0053576 A1 * | 3/2007 | Neureuther et al. | ......... | 382/144 |

OTHER PUBLICATIONS

Hecht, E., "Optik," 2. Auflage, Addison-Verlag, Bonn; Seite 558ff.

* cited by examiner

*Primary Examiner*—Bhavesh Mehta
*Assistant Examiner*—Manav Seth
(74) *Attorney, Agent, or Firm*—Slater & Matsil, L.L.P.

(57) ABSTRACT

The invention, which relates to a method for checking periodic structures on lithography masks, in which an image of the structure of the lithography mask is generated by an imaging optic of a microscope, provides a method for inspecting structures on lithography masks which is used to represent deviations in the periodic structure of a lithography mask, a better demarcation of the periodic structure from a deviation being achieved. The parameters of wavelength λ, the numerical aperture NA and the coherence of the illumination σ of the imaging optic of the microscope are chosen such that the inequality $$P \le \frac{\lambda}{NA(1+\sigma)}$$

describing the resolution limit for a periodic structure having the period P is fulfilled, and in that the image of the structure that is generated in this way is evaluated for deviations in the periodic structure.

15 Claims, 4 Drawing Sheets

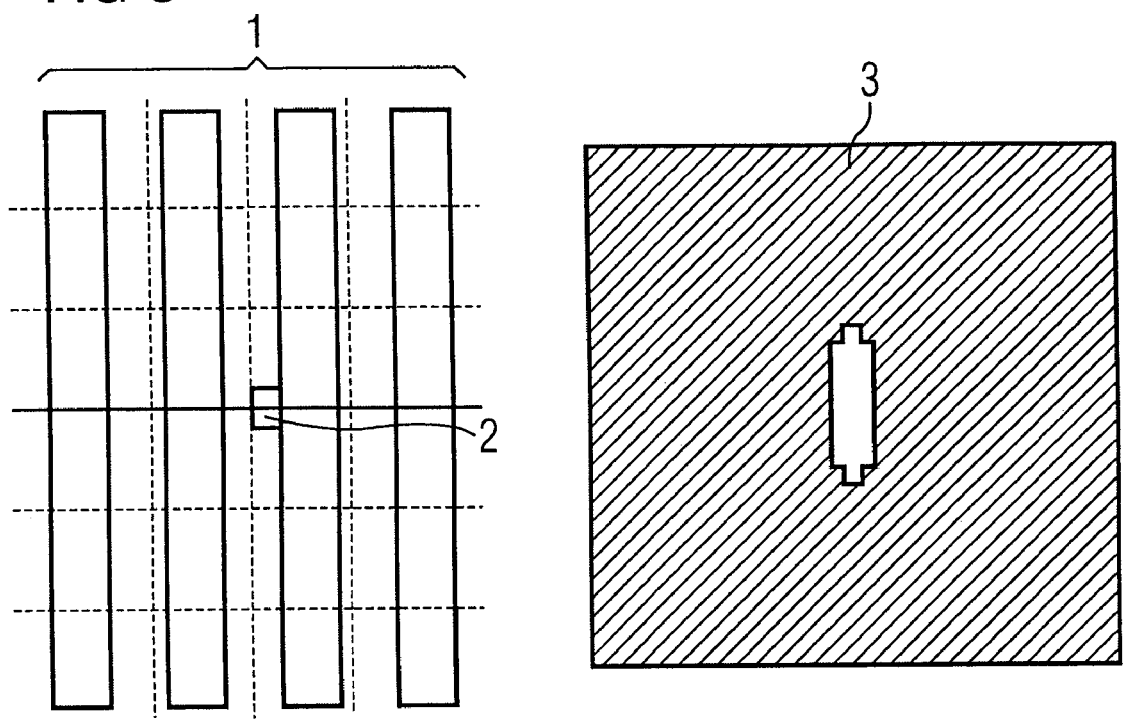

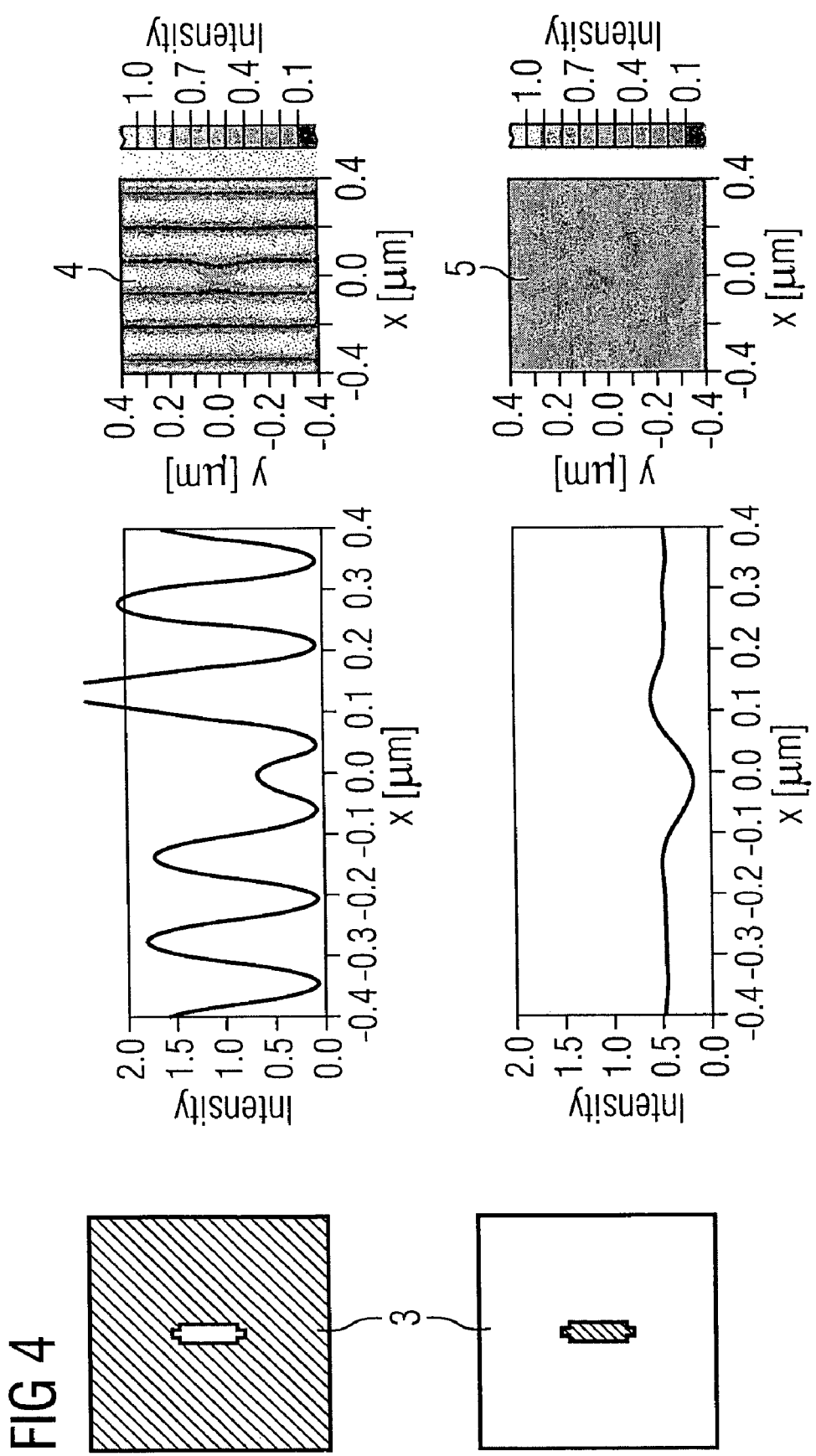

FIG 5A
DE100 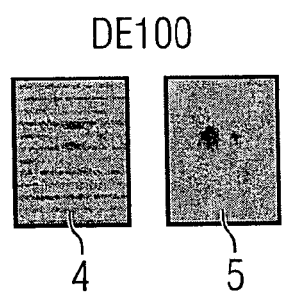
DE60 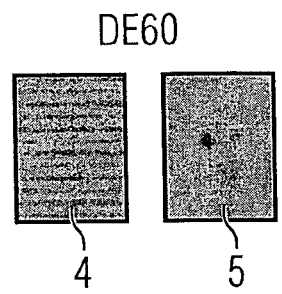
DE500 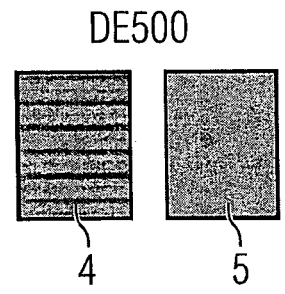
FIG 5B
CE300 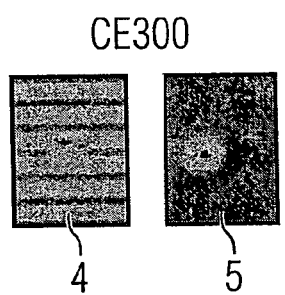
CE100 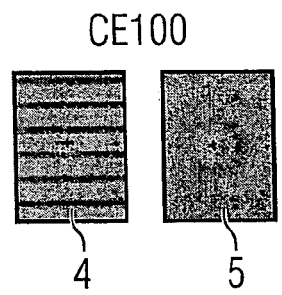
CE60 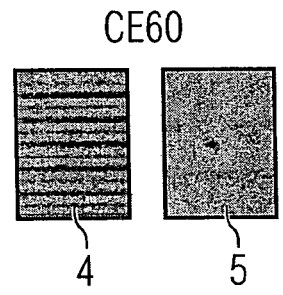

METHOD FOR CHECKING PERIODIC STRUCTURES ON LITHOGRAPHY MASKS

This application claims priority to German Patent Application 103 35 565.0, which was filed Jul. 31, 2003 and is incorporated herein by reference.

TECHNICAL FIELD

The invention relates to a method for checking periodic structures on lithography masks, in which an image of the structure of the lithography mask is generated by an imaging optic of a microscope.

BACKGROUND

In microlithography, as is known, semiconductor structures are realized by means of the imaging of a structure, produced beforehand on a lithography mask, on a photoresist-coated wafer by means of the exposure and subsequent development of the photoresist.

After the fabrication of the lithography mask, the latter has various properties which change from mask to mask. During the imaging thereof, these various properties have a considerable influence on the photolithography. In this case, a distinction is made between general (global) and local properties, which are normally specified.

Examples of global properties are the deviation of the line width (CD target value) from the target dimension (offset error), and also the fluctuation in the deviation over the image field (uniformity error). In the case of alternating phase masks, there are structures which have phase-shifting properties in the case of coherent illumination. These phase shifters are realized by etching structures into the glass. Deviations from the ideal etching depth result in undesirable brightness deviations, which likewise represent a global mask property.

Local properties are defects on the mask which have either arisen as a result of faults during mask production, or else subsequent contaminants, e.g. due to dust.

Therefore, the aim in the production of lithography masks is to produce a lithography mask which fulfils all the requirements made of accuracy and freedom from faults. With reference to the local properties, the masks are at the present time tested by means of process control and quality measurements.

In the prior art, systematic fabrication faults of lithography masks, such as regular deviations of the line spacing (offset target area) and changes in the line width (uniformity error), are measured directly at the structures by means of various SEM measurements (scanning electron microscopy) on any points of the mask. This may be a time-consuming and unreliable evaluation process since the measurement errors and the poor repeatability of an SEM are disadvantageous. Thus, by way of example, the direction of an electron beam significantly influences the measurement result. For this reason, this method is not suitable for lithography masks etched into quartz since, in the case of these masks, there are no well-defined edges for the SEM line width measurement. A further problem is the contamination of the mask material by carbon deposits which arise during the measurement process.

For new mask technologies, such as interference masks, the mask evaluation becomes very difficult. Interference masks contain trenches which have been etched into the mask and effect a defraction (phase shift) of the transmitted light. However, there is no established method for determining the defraction and transfer parameters.

The etching depth of the trenches in alternating phase masks is controlled by employing a combination of depth measurement and optical measurement using an MSM microscope (microlithography simulation microscope). The measured values obtained with such a microscope are finally compared with line width measurements of patterned wafers in order to obtain an item of information about the value of the newly produced lithography masks.

A further aim is now to go over to defect inspection. Since some defects on the lithography mask are transferred to the chips shaped on the wafer, it is very important to ensure a fault-free mask structure. Since each process step in mask fabrication unavoidably generates some defects in the lithography mask, it is necessary to be able to inspect and repair lithography masks.

During mask inspection, the lithography mask is examined for defects and the defects found are classified according to their importance for the lithography and the influence on the functionality of the chip. Mask defects which jeopardize the functionality and reliability of the chip function must necessarily be repaired.

The test devices used at the present time utilize laser scanning microscopy in order to check lithography masks for defects. In this case, the mask surface is scanned with a laser beam and the reflected and transmitted light is measured. In the case of defect-free regions, the sum of the reflected and the transmitted light lies above a predefined value, whereas the light is scattered in the case of defects, so that the sum of the intensities differs from a predefined value.

In the case of high-end masks, this approximation is expanded in various ways; thus, by way of example, instead of the comparison with a reference signal (die-to-database), an adjacent chip is utilized as a reference for "die-to-die" inspection, the chip surface in each case being subdivided into arrays to be examined and the arrays then being compared in pairs.

In the case of standard-quality masks, this approximation is simple and efficient with regard to the inspection time and costs. In the case of high-end masks, and in particular in the case of interference masks, this approximation suffers from the fact that these utilize a different lower wavelength than during the concluding lithography step. However, since a lower wavelength means a lower resolution, the sensitivity with regard to defects is lower than during the concluding lithography process.

Another problem of the laser scanning method is that the interference masks (defraction gratings) are seen very differently during laser scanning and during optical imaging.

One solution to this problem consists in simulating the lithographic imaging process with a modified microscope. Such a type of lithography microscope is designated in an abbreviated manner by the product name MSM (microlithography simulation microscope) and is offered for example by the company ZEISS. The MSM has the advantage that it uses the same wavelength as during the lithography process, the same illumination of the lithography mask and the same optical specifications for the aperture angle of the projection optic.

In contrast to lithographic exposure, during which the image of the lithography mask is demagnified, the MSM magnifies the image of the lithography mask on to a sensor. Furthermore, the MSM can only image a small section of the mask simultaneously.

During the progressive scanning of the lithography mask, it is possible to record images thereof which essentially correspond to the intensity with which a wafer would be exposed.

If a fault has a major influence on the exposure of the resist, this would be evident from the aerial image which has been recorded by the MSM microscope. In order, however, to be able to utilize the microscope for the inspection, a fault signal which signals the defect is required. Consequently, the lithography mask must have various identical chip layouts, so that the microscope can compare these images in pairs or the entire image of a fault-free lithography mask is present for the comparison in a memory.

A disadvantage of this method is that each image of the lithography mask is influenced by the general noise, and that the ultimate fault image has a relatively high noise.

A further disadvantage of this method is the complexity thereof in that the entire image of a lithography mask has to be scanned into the memory of the computer, partially adjusted prior to a comparison and subsequently compared. This requires both a considerable storage capacity and considerable computation time.

SUMMARY OF THE INVENTION

Consequently, aspects of the invention provide a method for checking structures on lithography masks which is used to represent deviations in the periodic structure of a lithography mask, a better demarcation of the periodic structure from a deviation being achieved.

In one aspect, the invention provides a method of the type mentioned in the introduction that achieves advantages, by virtue of the fact that the parameters of wavelength $\lambda$, the numerical aperture NA and the coherence of the illumination $\sigma$ of the imaging optic of the microscope are chosen such that the inequality $$P \le \frac{\lambda}{NA(1+\sigma)}$$

describing the resolution limit for a periodic structure having the period P is fulfilled, and in that the image of the structure that is generated in this way is evaluated for deviations in the periodic structure.

In principle, the numerical aperture and also the pitch can be defined at the mask or wafer. In order to avoid conversions incurred as a result of the demagnification factor of the imaging optic, all the co-ordinates are always specified at the wafer. This means that the parameter P for the pitch can be defined more simply; the pitch P is thus the pitch of the gratings to be patterned on the wafer, independently of whether an oblique illumination technology or alternating phase mask technology is used. An imaging optic, for example of a microscope, is essentially described by the parameters of wavelength $\lambda$, the aperture angle of the lens represented by the numerical aperture NA, and the coherence of the illumination $\sigma$. The resolution limit for a grating having a period P is described with these optical parameters by the inequality $$P \le \frac{\lambda}{NA(1+\sigma)}.$$

This inequality shows that both a short wavelength of the illumination source used and a large numerical aperture and coherence of the illumination are necessary for a high-contrast imaging of small periodic structures. For the method according to the invention, however, through the choice of suitable quantities for the optical parameters, a low-contrast image of the periodic grating structure is generated for a defect inspection of a lithography mask, or, to put it differently, the grating is not resolved optically. In the image generated in this way, the fault-free periodic structures are represented for example by a high illumination intensity, whereas the faulty, non-periodic portions of the structure of a lithography mask that is to be examined are represented by a low illumination intensity. The image generated thus exhibits the defect locations of the lithography mask by means of clearly discernible illumination intensity differences. The method according to the invention can be used to examine both linear gratings and contact hole gratings.

One refinement of the invention provides for the coherence of the illumination $\sigma$ to be defined by means of an illumination diaphragm.

In the prior art, various diaphragm forms are used for optimizing a high-contrast imaging. In the case of the solution according to the invention, too, the optical parameter of coherence of the illumination $\sigma$ is influenced by means of an illumination diaphragm and the inequality presented in the main claim is thus fulfilled.

A further refinement of the invention provides for the illumination diaphragm to be an inverted illumination diaphragm of the illumination diaphragm which is optimized for a high-contrast imaging.

In order to obtain a high-contrast image of a periodic structure during defect inspection, use is made of specific illumination diaphragms that are optimized in respect thereof. However, the method according to the invention generates an image that is not a high-contrast image. For this purpose, by way of example, it is possible to utilize an inverted illumination diaphragm of an illumination diaphragm which is suitable for a high-contrast imaging, the locations of the diaphragm which impart contrast to the grating being shaded.

A particular embodiment of the invention provides for the image generated to be evaluated by means of an electronic threshold value identification.

The image generated by the method with its illumination intensity differences can be evaluated by means of an electronic threshold value identification, during which an error signal is output in the event of a permissible deviation being exceeded.

One refinement of the invention provides for the image generated to be evaluated by means of a manual evaluation.

The image generated by the method can also be assessed manually, for example by visual evaluation of a monitor image. This possibility is of importance especially when the local position of a defect on the lithography mask is known, for example after the repair of a defect location.

One embodiment of the invention provides for a first image generated to be compared with a second image generated, and for an error signal to be output in the event of a defined maximum deviation between the two images being exceeded.

By means of the method according to the invention, a first image of a first periodic or non-periodic structure is generated, and a second image of a second, equivalent periodic or non-periodic structure that is adjacent on the lithographic mask, for example, is generated simultaneously or afterwards. The images are compared with one another electronically (e.g. die-to-die) and, in the event of a predetermined deviation being exceeded, an error signal is output during the defect inspection.

BRIEF DESCRIPTION OF THE DRAWINGS

The invention will be explained in more detail below on the basis of two exemplary embodiments. In the associated drawings:

FIG. 3 shows a periodic structure with a defect and a slit-type illumination diaphragm;

FIG. 4 shows an image of a defect according to the prior art with a slit diaphragm optimized for contrast and an image—according to the method—of the same defect for the inverted illumination diaphragm of the optimum illumination diaphragm, and FIGS. 5A and 5B, collectively FIG. 5, show further images according to the invention of various defects, in each case in comparison with the image from the prior art.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
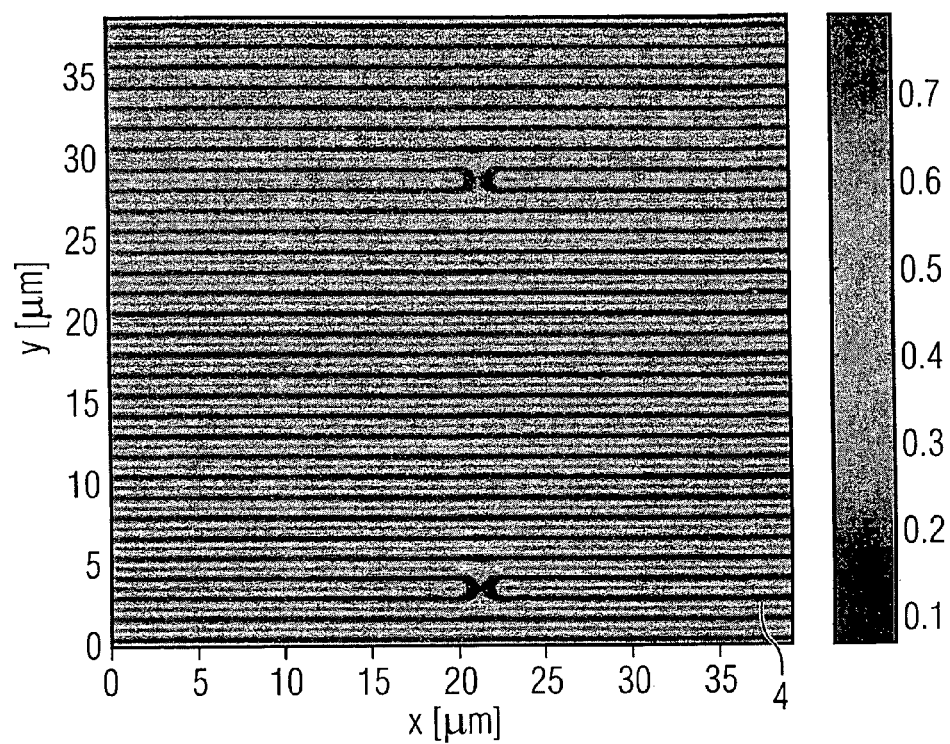
FIG. 1 shows a fault image from the prior art.

One goal in the production of lithography masks, is to eliminate (or at least minimize) defects 2. A work step of mask inspection for finding defects 2 is carried out for this reason. For this purpose, an image 4 of the periodic structure 1 of a lithography mask, as illustrated in FIG. 1, is generated and evaluated for example by means of an imaging optic of a microscope.

Figure 2:
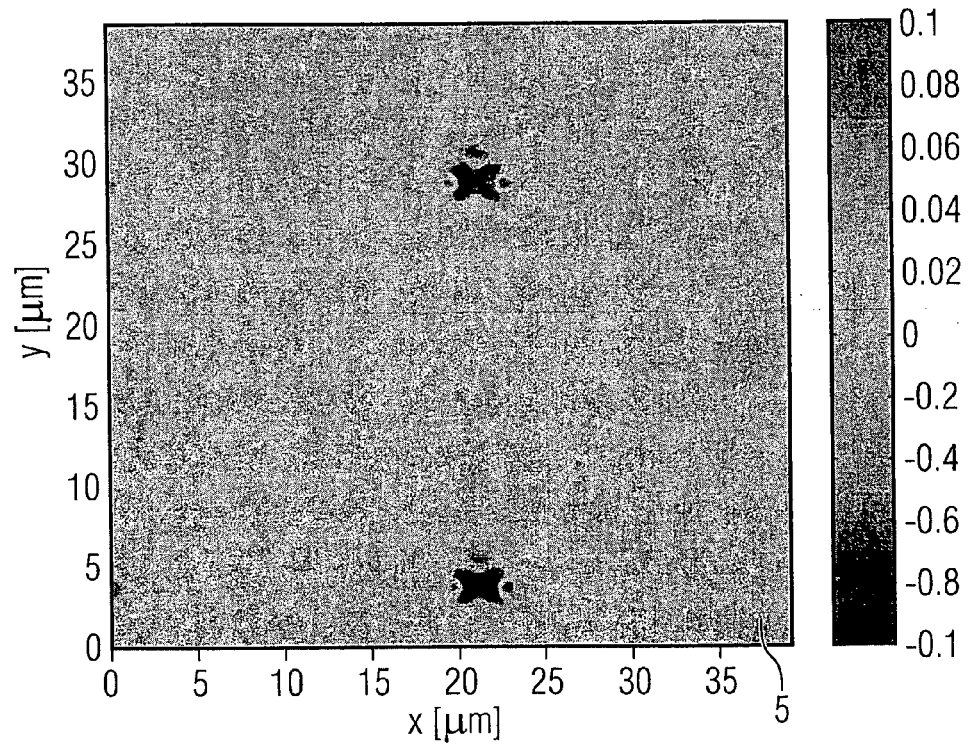
FIG. 2 shows a fault image generated by the method according to the invention.

The imaging optic is essentially described by the parameters of wavelength λ, the aperture angle of the lens represented by the numerical aperture NA, and the coherence of the illumination σ. Whereas in the prior art the optical parameters are chosen such that the periodic structure 1 is imaged with the best possible contrast, the selection of the parameters in the method according to the preferred embodiment of the invention is geared towards the periodic structure 1 precisely not being resolved, as illustrated in FIG. 2.

The parameters are chosen in the method according to the preferred embodiment such that the inequality $$P \le \frac{\lambda}{NA(1+\sigma)}$$

is fulfilled. By virtue of this inequality, the resolution limit for a periodic structure 1 having a period P, where the period is the pitch of the grating patterned on the wafer, becomes independent of whether an oblique illumination technology or alternating phase mask technology is used.

FIG. 3 illustrates a chromeless alternating periodic 70 nm structure 1. The mask structure contains a defect 2 (phase defect). An optimum illumination setting for a numerical aperture where NA=0.75 is a slit-type illumination diaphragm 3. The calculated image which results with this setting and the image 4 generated by means of the prior art are illustrated in FIG. 4. The image of the defect 2 without the periodic structure 1 is achieved for example by using the inverted illumination diaphragm 3, as likewise illustrated in FIG. 4. In the image 5 according to the method which is generated in this way, the defect 2 is represented by a lower illumination intensity. By contrast, the periodic structure 1 is no longer imaged. This image 5 according to the method makes it possible to evaluate the image 5 for defects 2 by means of a simple threshold value identification and, in the event of a defined limit value being exceeded, to output an error signal which marks a defect 2 found on the lithography mask during the mask inspection.

A circular illumination diaphragm 3 is used in a second exemplary embodiment. In this case, too, the parameters of coherence and numerical aperture have to be chosen such that the resolution inequality $$P > \frac{\lambda}{NA(1+\sigma)}$$

is precisely not fulfilled. For a periodic structure 1 having a period P, numerical aperture NA and the wavelength λ, the coherence is chosen in accordance with the inequality $$\sigma \le \frac{\lambda}{P * NA} - 1.$$

This expression is valid both for binary lithography masks and for interference masks, which include, by way of example, alternating masks and chromeless alternating masks. In this example, a halftone phase mask having a periodic structure 1 for 90 nm line-gap gratings (period P=180 nm) was examined. The nominal exposure is carried out at an NA=0.70 and an annular exposure of s=0.85/0.53. In order to filter out the periodic structure 1, the maximum coherence according to the above-described inequality of 0.53 is permissible:

$$\sigma \le \frac{193 \text{ nm}}{180 \text{ nm} * 0.7} - 1 = 0.53$$

A coherence of 0.2 was used for the example. The result with an AIMS (aerial image measurement system) is illustrated in FIG. 5. Various faults in each case with various optical parameters are compared in pairs in this Figure. In this case, for the resolution of the periodic structure 1 respectively illustrated on the left in the pair of images, the parameters NA=0.7 and σ=0.85/0.53 were chosen in the case of a 90 nm structure. The parameters NA=0.7 and σ=0.2 were chosen for generating the image 5 according to the invention represented on the right in each pair of images. Consequently, as illustrated in FIG. 5, the representation is essentially reduced to the defect location 2 of the lithography mask. It can likewise be discerned from this representation 5 that the complexity in the case of image recognition is likewise reduced as a result of the reduction of the image information.

Although the present invention and its advantages have been described in detail, it should be understood that various changes, substitutions and alterations can be made herein without departing from the spirit and scope of the invention as defined by the appended claims.

What is claimed is:

1. A method for checking periodic structures on a lithography mask, the method comprising:
   inverting an illumination diaphragm of an optical microscope, the illumination diaphragm optimized for high-contrast imaging;
   selecting parameters for an illumination system of the optical microscope, wherein the parameters of wavelength λ, numerical aperture NA and coherence of the illumination σ are chosen such that the inequality $$P \le \frac{\lambda}{NA(1+\sigma)}$$

describing the resolution limit for a periodic structure having a period P is fulfilled;
   imaging structures on the lithography mask using the optical microscope; and
   evaluating the imaged structures for deviations in the periodic structures.

2. The method according to claim 1, wherein the coherence of the illumination σ is defined by means of the illumination diaphragm.

3. The method according to claim 1, wherein evaluating the imaged structures comprises using electronic threshold value identification.

4. The method according to claim 1, wherein evaluating the imaged structures comprises using manual evaluation.

5. The method according to claim 1, wherein imaging structures on the lithography mask comprises generating a first image and a second image, and evaluating the imaged structures comprises comparing the first and second images and outputting an error signal if a defined maximum deviation between the two images is exceeded.

6. A method for checking periodic structures on lithography masks, the method comprising:
   providing a lithography mask that includes a periodic structure having a period P;
   inverting an illumination diaphragm of a microscope, the illumination diaphragm optimized for high-contrast imaging;
   generating an image of the periodic structure of the lithography mask using an imaging optic of the microscope, wherein the imaging optic of the microscope is chosen such that the inequality $$P \le \frac{\lambda}{NA(1+\sigma)}$$

describing a resolution limit for the periodic structure having the period P is fulfilled, wherein λ is a wavelength of radiation used in the imaging, NA is a numerical aperture of the microscope and σ is a coherence of the illumination; and
   evaluating the image of the periodic structure for deviations in the periodic structure.

7. The method according to claim 6, wherein the coherence of the illumination σ is defined by means of the illumination diaphragm.

8. The method according to claim 6, wherein evaluating the image comprises evaluating by means of an electronic threshold value identification.

9. The method according to claim 6, wherein evaluating the image comprises evaluating by means of a manual evaluation.

10. The method according to claim 6, further comprising:
    generating a second image;
    comparing the image with the second image; and
    outputting an error signal if a defined maximum deviation between the image and the second image is exceeded.

11. A method of manufacturing a semiconductor device, the method comprising:
    providing a lithography mask that includes a periodic structure having a period P;
    inverting an illumination diaphragm of a microscope, the illumination diaphragm optimized for high-contrast imaging;
    generating an image of the periodic structure of the lithography mask using an imaging optic of a microscope, wherein the imaging optic of the microscope are chosen such that the inequality $$P \le \frac{\lambda}{NA(1+\sigma)}$$

describing the resolution limit for the periodic structure having the period P is fulfilled, wherein λ is a wavelength of radiation used in the imaging, NA is a numerical aperture of the microscope and σ is a coherence of the illumination;
    evaluating the image of the periodic structure for deviations in the periodic structure;
    identifying fault-free structures based on the evaluation of the image;
    providing a photoresist-coated wafer; and
    forming a semiconductor structure by imaging the fault-free structures of the lithography mask on the wafer.

12. The method according to claim 11, wherein the coherence of the illumination σ is defined by means of the illumination diaphragm.

13. The method according to claim 11, wherein evaluating the image comprises evaluating by means of an electronic threshold value identification.

14. The method according to claim 11, wherein evaluating the image comprises evaluating by means of a manual evaluation.

15. The method according to claim 11, further comprising:
    generating a second image;
    comparing the image with the second image; and
    outputting an error signal in the event that a defined maximum deviation between the image and the second image is exceeded.

* * * * *